(12) United States Patent
Wang

(10) Patent No.: US 12,727,213 B2
(45) Date of Patent: Sep. 1, 2026

(54) MANUFACTURING METHOD OF SEMICONDUCTOR STRUCTURE WITH FLAT ISOLATION LAYER AND SEMICONDUCTOR STRUCTURE

(71) Applicant: CHANGXIN MEMORY TECHNOLOGIES, INC., Hefei City (CN)

(72) Inventor: Tonghui Wang, Hefei City (CN)

(73) Assignee: ChangXin Memory Technologies, Inc., Hefei (CN)

( * ) Notice: Subject to any disclaimer, the term of this patent is extended or adjusted under 35 U.S.C. 154(b) by 434 days.

(21) Appl. No.: 18/364,008

(22) Filed: Aug. 2, 2023

(65) Prior Publication Data

US 2024/0072112 A1 Feb. 29, 2024

Related U.S. Application Data

(63) Continuation of application No. PCT/CN2022/124615, filed on Oct. 11, 2022.

(30) Foreign Application Priority Data

Aug. 24, 2022 (CN) ......................... 202211020370.2

(51) Int. Cl.
*H10D 62/10* (2025.01)
*H10D 64/27* (2025.01)
(Continued)

(52) U.S. Cl.
CPC ......... *H10D 62/115* (2025.01); *H10D 64/513* (2025.01); *H10D 84/0167* (2025.01);
(Continued)

(58) Field of Classification Search
CPC ............... H10D 62/115; H10D 64/513; H10D 84/0188; H10W 10/014; H10W 10/17
See application file for complete search history.

(56) References Cited

U.S. PATENT DOCUMENTS 9,847,408 B1 12/2017 Jain et al.
2009/0283837 A1 11/2009 Huebinger et al.
(Continued)

FOREIGN PATENT DOCUMENTS

CN 1449013 A 10/2003
CN 1738045 A 2/2006
(Continued)

OTHER PUBLICATIONS

Taiwan Patent Office, First Office Action Issued in Application No. 112131163, Feb. 26, 2024, 8 pages.
(Continued)

*Primary Examiner* — Nelson Garces
(74) *Attorney, Agent, or Firm* — Intellectual Property Law, P.C.

(57) ABSTRACT

The present disclosure provides a manufacturing method of a semiconductor structure and a semiconductor structure and relates to the technical field of semiconductors. The manufacturing method of a semiconductor structure includes: providing a substrate, where the substrate includes a first region and a second region, the first region includes a plurality of independent first active regions, adjacent two of the first active regions are isolated by a first trench, and an isolating lamination layer is formed in the first trench; forming a barrier layer covering a top surface of the second region; forming an epitaxial layer covering a top surface of the first active region; and etching off the barrier layer and part of the isolating lamination layer in the first region, where joints of top surfaces of layers in the isolating lamination layer retained in the first region are basically consistent in height.

10 Claims, 8 Drawing Sheets

(51) Int. Cl.
*H10D 84/01* (2026.01)
*H10D 84/03* (2025.01)
*H10D 84/85* (2025.01)

(52) U.S. Cl.
CPC ....... *H10D 84/0188* (2025.01); *H10D 84/038* (2025.01); *H10D 84/85* (2025.01)

(56) References Cited

U.S. PATENT DOCUMENTS

| | | | | |
|---|---|---|---|---|
| 2011/0086495 | A1 | 4/2011 | Pal et al. | |
| 2021/0125873 | A1 | 4/2021 | Li et al. | |
| 2022/0189969 | A1* | 6/2022 | Kim | H10B 12/50 |

FOREIGN PATENT DOCUMENTS

| | | | |
|---|---|---|---|
| CN | 104882406 | A | 9/2015 |
| CN | 107527866 | A | 12/2017 |
| CN | 109509764 | A | 3/2019 |

OTHER PUBLICATIONS

The Extended European Search Report issued in European corresponding application No. 22924577.4 mailed on Apr. 1, 2025, 10 pages.

International Search Report cited in PCT/CN2022/124615 mailed Jan. 18, 2023, 8 pages.

* cited by examiner

MANUFACTURING METHOD OF SEMICONDUCTOR STRUCTURE WITH FLAT ISOLATION LAYER AND SEMICONDUCTOR STRUCTURE

CROSS-REFERENCE TO RELATED APPLICATIONS

This is a continuation of International Patent Application No. PCT/CN2022/124615, filed Oct. 11, 2022, which claims the priority to Chinese Patent Application No. 202211020370.2, titled "MANUFACTURING METHOD OF SEMICONDUCTOR STRUCTURE AND SEMICONDUCTOR STRUCTURE" and filed on Aug. 24, 2022. The disclosures of International Patent Application No. PCT/CN2022/124615 and Chinese Patent Application No. 202211020370.2 are incorporated herein by reference in their entireties.

TECHNICAL FIELD

The present disclosure relates to, but is not limited to, a manufacturing method of a semiconductor structure and a semiconductor structure.

BACKGROUND

With the development of integrated circuits, the feature size of semiconductor devices continues to decrease, and traditional channel materials no longer meet requirements of the drive current of p-channel metal oxide semiconductor (PMOS) devices. It is necessary to use epitaxial growth to form a silicon germanide (SiGe) layer on the substrate surface as the channel material of the PMOS devices to improve its mobility, thereby increasing the operating saturation current (Idsat) and response speed of the PMOS devices and improving the performance of the PMOS devices.

The epitaxial formation of SiGe layer imposes high requirements on the substrate surface, and the contamination or residual oxide layer on the substrate surface will lead to lattice defects of the epitaxial growth such as layer errors, dislocations, or line slipping. Therefore, the substrate needs to be pre-cleaned before the epitaxial growth of the SiGe layer to remove the oxide layer on the substrate surface. However, the pre-cleaning process will deplete part of the shallow trench isolation (STI) structure, resulting in dishing of the top surface of the STI structure. In addition, too deep dishing region between the isolation structure forming the circuit region and the substrate leads to a fault layer, which can easily result in charge leakage from the PMOS devices.

SUMMARY

The following is a summary of a subject that is described in detail herein. This summary is not intended to limit the scope of protection of the claims. The present disclosure provides a manufacturing method of a semiconductor structure and a semiconductor structure.

A first aspect of the present disclosure provides a manufacturing method of a semiconductor structure. The manufacturing method of a semiconductor structure includes:

providing a substrate, where the substrate includes a first region and a second region, the first region includes a plurality of independent first active regions, adjacent two of the first active regions are isolated by a first trench, and an isolating lamination layer is formed in the first trench;

forming a barrier layer covering a top surface of the second region;

forming an epitaxial layer covering a top surface of the first active region; and etching off the barrier layer and part of the isolating lamination layer in the first region, where joints of top surfaces of layers in the isolating lamination layer retained in the first region are basically consistent in height.

A second aspect of the present disclosure provides a semiconductor structure, including:

a substrate, where the substrate includes a first region and a second region, the first region includes a plurality of independent first active regions, and adjacent two of the first active regions are isolated by a first trench;

a first isolation structure disposed in the first trench, where the first isolation structure includes a structure of multiple layers sequentially covering the first trench, and joints of top surfaces the layers of the first isolation structure are basically consistent in height; and an epitaxial layer covering a top surface of the first active region.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

The technical solutions in the embodiments of the present disclosure are described below clearly and completely referring to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Currently, the shallow trench isolation structure is usually presented as an oxide-nitride-oxide (ONO) structure. In the pre-cleaning process before epitaxial formation of the SiGe layer, part of the oxide may be removed from the shallow trench isolation structure, a groove is formed in a position of the shallow trench isolation structure close to the active region, and the groove will be deepened during the subsequent process. After the epitaxial layer is formed, the depth of the groove is about 15 nm, the top of the nitride of the shallow trench isolation structure is higher than the oxide and a turf defect is formed on the top surface of the shallow trench isolation structure. This turf defect is likely to collect charge and form an electron trap, which causes the charge of the PMOS device formed subsequently to spread to the turf and thus leads to the problem of gate oxygen charge leakage, resulting in the degradation of device performance and yield in the semiconductor structure.

Figure 1:
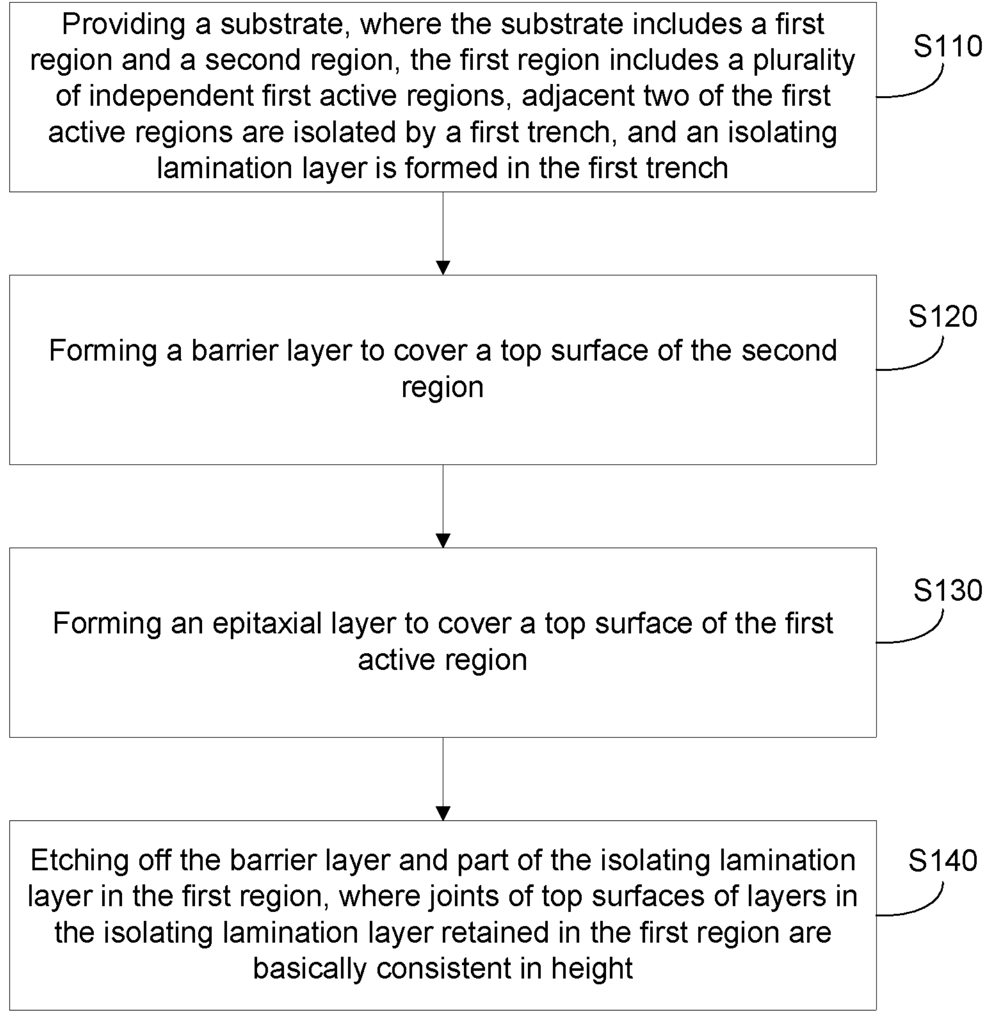
FIG. 1 is a flowchart of a manufacturing method of a semiconductor structure according to an exemplary embodiment.

An exemplary embodiment of the present disclosure provides a manufacturing method of a semiconductor structure, as shown in FIG. 1. FIG. 1 is a flowchart of a manufacturing method of a semiconductor structure according to an exemplary embodiment of the present disclosure. FIGS. 4 to 17 are schematic diagrams of various states of a manufacturing method of a semiconductor structure. The manufacturing method of a semiconductor structure is described below with reference to FIGS. 4 to 17.

The semiconductor structure is not limited in this embodiment. The semiconductor structure is described below by taking a dynamic random access memory (DRAM) as an example, but the embodiment is not limited thereto. The semiconductor structure in this embodiment may also be other structures.

As shown in FIG. 1, an exemplary embodiment of the present disclosure provides a manufacturing method of a semiconductor structure, including the following steps:

Step S110: Providing a substrate, where the substrate includes a first region and a second region, the first region includes a plurality of independent first active regions, adjacent two of the first active regions are isolated by a first trench, and an isolating lamination layer is formed in the first trench.

Figure 4:
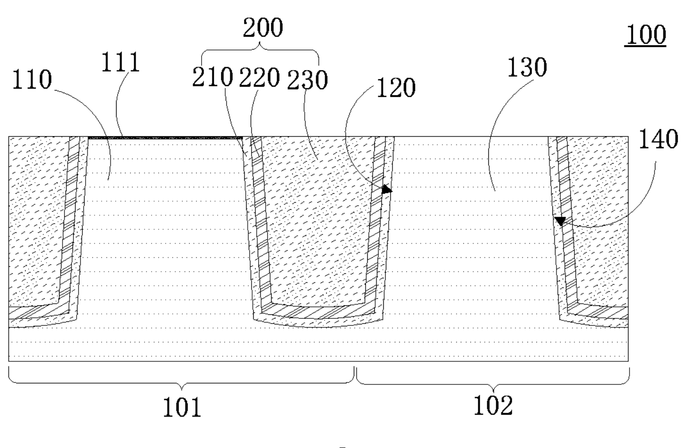
FIG. 4 is a schematic structural diagram of a substrate according to an exemplary embodiment.

As shown in FIG. 4, the substrate 100 may be a semiconductor substrate, and the semiconductor substrate may include a silicon crystal substrate, a germanium (Ge) substrate, a SiGe substrate, a silicon-on-insulator (SOI) substrate, or a germanium-on-insulator (GOI) substrate, or the like. The semiconductor substrate may be further doped with ions. In this embodiment, the substrate 100 is a silicon crystal substrate.

The substrate 100 includes one or more first regions 101, where the first region 101 includes a plurality of independent first active regions 110, the adjacent first active regions 110 are separated by a first trench 120. The substrate 100 also includes a second region 102, where the second region 102 is a region of the substrate 100 other than the first region 101, and a semiconductor device may be formed in the second region 102.

The isolating lamination layer 200 includes a multi-layer structure covering the first trench 120. In this embodiment, the isolating lamination layer 200 includes a first isolation layer 210, a second isolation layer 220, and a third isolation layer 230 that sequentially cover the first trench 120. The first isolation layer 210 covers a bottom wall and a side wall of the first trench 120, the second isolation layer 220 covers the first isolation layer 210, and the third isolation layer 230 covers the second isolation layer 220 and fills a region unfilled in the first trench 120. The first isolation layer 210 and the third isolation layer 230 have the same etch selectivity, and the first isolation layer 210 and the second isolation layer 220 have different etch selectivity.

In this embodiment, the first isolation layer 210 and the third isolation layer 230 are made of the same material, and the first isolation layer 210 and the second isolation layer 220 are made of different materials. For example, the materials of the first isolation layer 210 and the third isolation layer 230 may include silicon oxide, and the material of the second isolation layer 220 includes silicon nitride.

Step S120: Forming a barrier layer covering a top surface of the second region.

Figure 5:
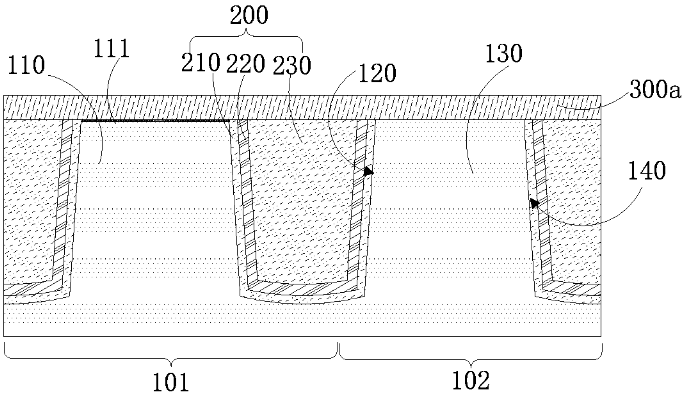
FIG. 5 is a schematic structural diagram of forming an initial barrier layer according to an exemplary embodiment.
Figure 11:
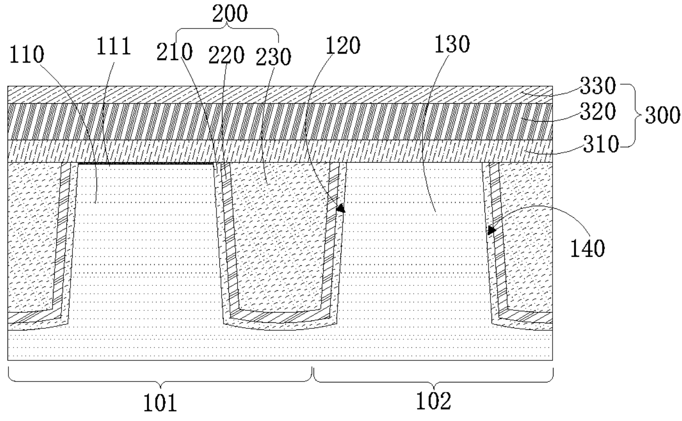
FIG. 11 is a schematic structural diagram of forming a barrier layer according to an exemplary embodiment.

As shown in FIG. 5 or 11, the barrier layer 300 may include a single-layer or laminated-layer structure. The barrier layer 300 at least covers the top surface of the second region 102, to prevent the subsequent process of the first region 101 from damaging the device in the second region 102.

Step S130: Form an epitaxial layer to cover a top surface of the first active region.

Figure 8:
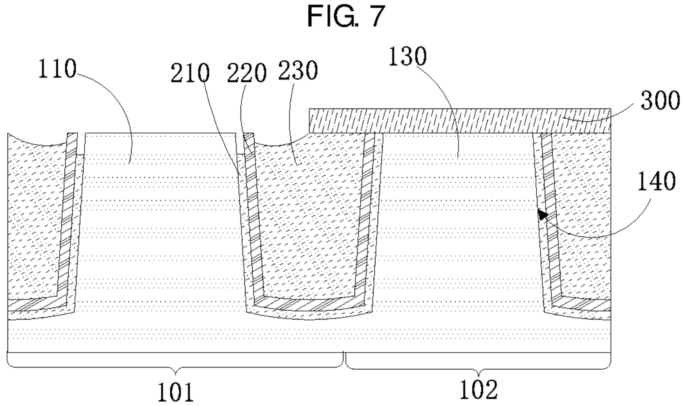
FIG. 8 is a schematic structural diagram of removing an oxide film through cleaning according to an exemplary embodiment.
Figure 14:
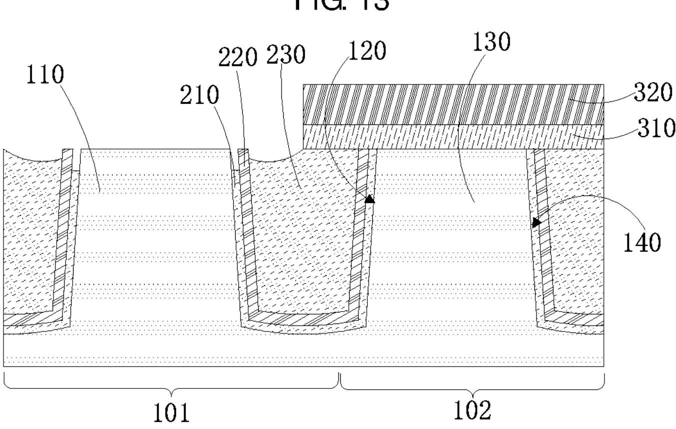
FIG. 14 is a schematic structural diagram of removing a first barrier layer in a first region according to an exemplary embodiment.

Referring to FIG. 4, the substrate 100 is exposed to the process environment and the surface of the first active region 110 may be oxidized by the environment to form an oxide film 111. In this embodiment, before the epitaxial layer 400 is formed, the first active region 110 is treated to remove the oxide film 111 from the surface of the first active region 110. As shown in FIG. 8 or 14, since the first isolation layer 210 and the third isolation layer 230 are also made of oxides, in the process of removing the oxide film 111, part of the first isolation layer 210 and part of the third isolation layer 230 exposed from the first region 101 are also removed. As a result, after the oxide film 111 on the surface of the first active region 110 is removed, top surfaces of the first isolation layer 210 and the third isolation layer 230 exposed from the first region 101 are lower than the top surface of the second isolation layer 220, and dishing is formed on the top surface of the isolating lamination layer 200. Especially, the first isolation layer 210 is thinner than the third isolation layer 230, resulting in a faster etching speed of the first isolation layer 210, and thus a narrow and deep groove is formed between the first active region 110 and the second isolation layer 220.

Figure 9:
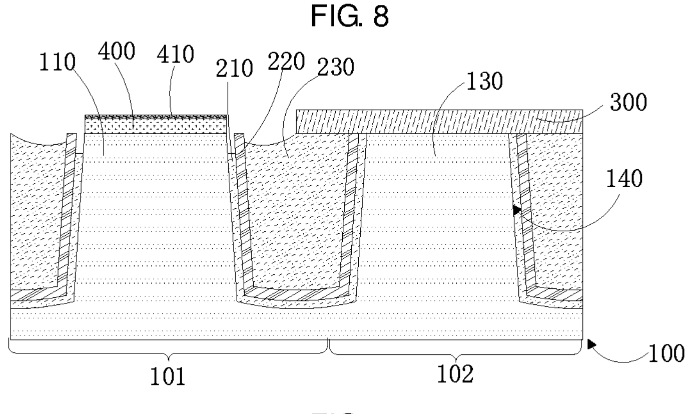
FIG. 9 is a schematic structural diagram of forming an epitaxial layer according to an exemplary embodiment.
Figure 15:
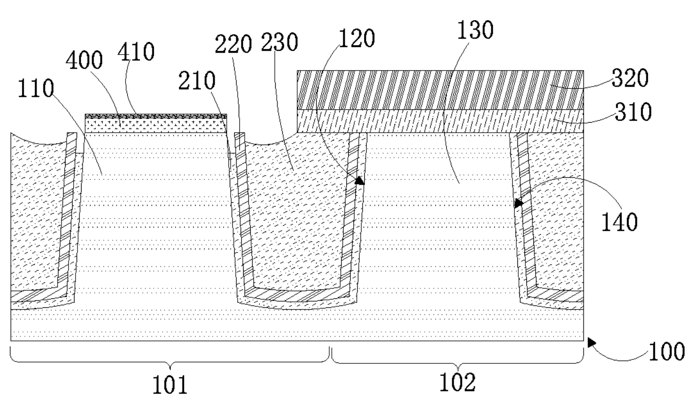
FIG. 15 is a schematic structural diagram of forming an epitaxial layer according to an exemplary embodiment.

In this embodiment, the epitaxial layer 400 is formed through the following implementations:

As shown in FIG. 9 or 15, the substrate 100 is placed in a reaction chamber, with the top surface of the first active region 110 as the seed crystal, a gas source for forming the epitaxial layer 400 is fed into the reaction chamber, and the epitaxial layer 400 is grown epitaxially in the first active region 110 by chemical vapor deposition process. The material of the epitaxial layer 400 may include silicon, Ge, SiGe, silicon carbide, gallium arsenide, or indium galliumide, and the epitaxial layer 400 may be doped with conductive dopant ions, and the concentrations of silicon at the top and bottom of the epitaxial layer 400 are greater than the concentration of silicon in the middle of the epitaxial layer 400.

Step S140: Etching off the barrier layer and part of the isolating lamination layer in the first region, where joints of top surfaces of layers in the isolating lamination layer retained in the first region are basically consistent in height.

Figure 7:
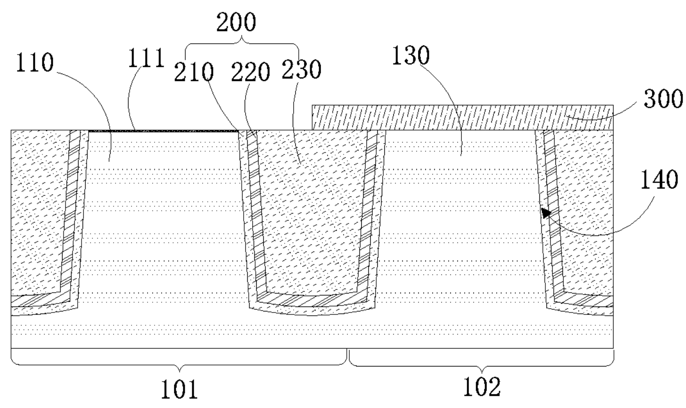
FIG. 7 is a schematic structural diagram of forming a barrier layer according to an exemplary embodiment.
Figure 10:
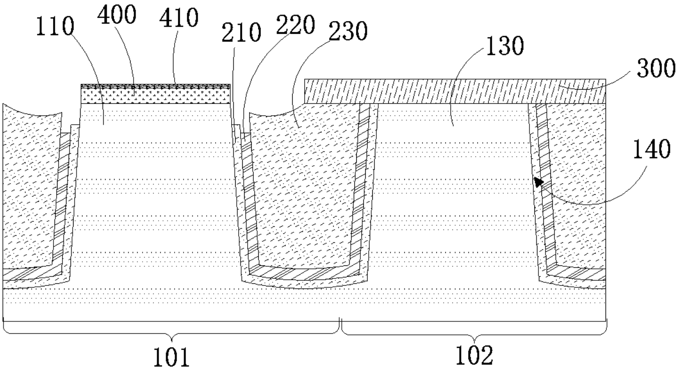
FIG. 10 is a schematic structural diagram of etching off part of a second isolation layer according to an exemplary embodiment.
Figure 17:
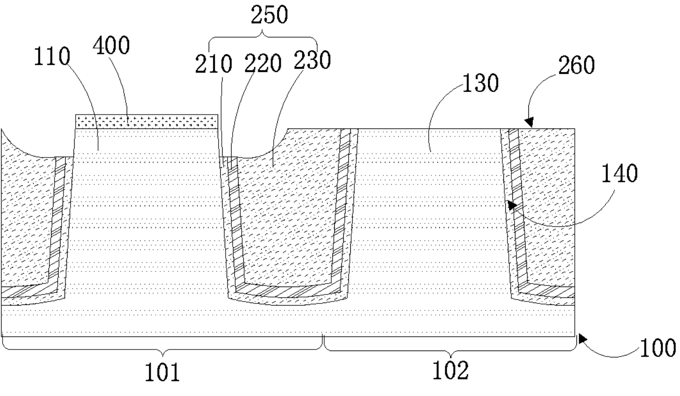
FIG. 17 is a schematic structural diagram of a semiconductor structure according to an exemplary embodiment.

As shown in FIGS. 10 and 17, with reference to FIGS. 7, 8, and 9, the process of etching the barrier layer 300 and the process of etching the isolating lamination layer 200 in the first region 101 may be performed simultaneously, or the process of etching the barrier layer 300 is only performed simultaneously with the process of etching the partial part of the isolating lamination layer 200 located in the first region 101. In this embodiment, the thickness of the barrier layer 300 can be controlled to adjust the depth by which the isolating lamination layer 200 in the first region 101 is etched, allowing the top surfaces of layers of the isolating lamination layer 200 retained in the first region 101 to be basically consistent in height, as shown in FIG. 17.

Figure 16:
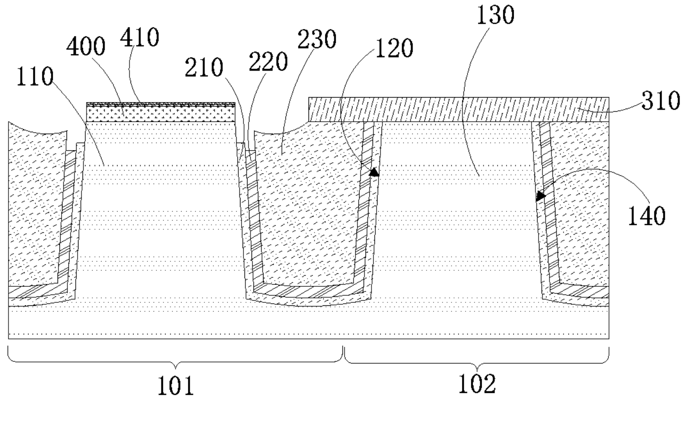
FIG. 16 is a schematic structural diagram of etching off part of a second isolation layer according to an exemplary embodiment.

In this embodiment, part of the isolating lamination layer 200 in the first region 101 may be removed through the following implementations:

As shown in FIGS. 10 and 16, first, removing part of the second isolation layer 220, and the top surface of the retained second isolation layer 220 is lower than the top surfaces of the first isolation layer 210 and the third isolation layer 230.

In this embodiment, as compared with the first isolation layer 210 and the third isolation layer 230, the process of etching the second isolation layer 220 has a high etch selectivity, ensuring the heights of the first isolation layer 210 and the third isolation layer 230 remain unchanged in the process of etching the second isolation layer 220.

As shown in FIG. 17, removing part of the first isolation layer 210 and part of the third isolation layer 230, and the top surface of the retained first isolation layer 210, the top surface of the third isolation layer 230, and the top surface of the retained second isolation layer 220 are basically consistent in height.

In this embodiment, the barrier layer 300 at least includes a material with the same etch selectivity as the material of the first isolation layer 210. The process of etching the barrier layer 300 is at least performed simultaneously with the process of etching part of the first isolation layer 210 and part of the third isolation layer 230 in the first region 101. The thickness of the barrier layer 300 can be adjusted to control the etching depths of the first isolation layer 210 and the third isolation layer 230 in the first region 101, such that the top surfaces of layers of the isolating lamination layer 200 retained in the first region 101 at joints are basically consistent in height.

In the manufacturing method of a semiconductor structure of this embodiment, after the epitaxial layer is formed on the top surface of the first active region, part of the isolating lamination layer in the first region is etched off, allowing the top surface of the isolating lamination layer retained in the first region to be flat with no local protrusion or dishing and no turf defect. This can prevent charge leakage from occurring to the device formed subsequently on the epitaxial layer, thus ensuring good performance and higher yield of the semiconductor structure.

According to an exemplary embodiment, this embodiment is an illustration of the above embodiment, and this embodiment includes all the steps of the above embodiment. The difference between this embodiment and the above embodiment is that after the formation of the epitaxial layer, this embodiment also performs the following steps:

As shown in FIG. 10 or 16, the protective layer 410 is formed to cover the top surface of the epitaxial layer 400, the protective layer 410 including a first material.

In this embodiment, the first material and the material of the first active region 110 are identical. For example, the material of the first active region 110 includes silicon, and the first material also includes silicon.

In this embodiment, the protective layer 410 is covered on the epitaxial layer 400 for protection, to avoid the damage to the epitaxial layer 400 caused by the subsequent process of etching the barrier layer 300 and the isolation lamination layer 200 exposed from the first region 101, thus ensuring the integrity of the top surface of the epitaxial layer 400 without damage, and avoiding the device formed subsequently on the epitaxial layer 400 leaks electric charge to the epitaxial layer 400.

In addition, the protective layer 410 is exposed to the process environment, and the first material in the subsequent process will be oxidized by the environment to be an oxide of the first material, and the oxidized protection layer 410 can be removed in the process of etching the isolating lamination layer 200 in the first region 101 without extra adding the step of removing the protective layer 410, thus ensuring that no first material or oxide remains on the formed epitaxial layer 400 while ensuring the simplification of the semiconductor process.

Figure 2:
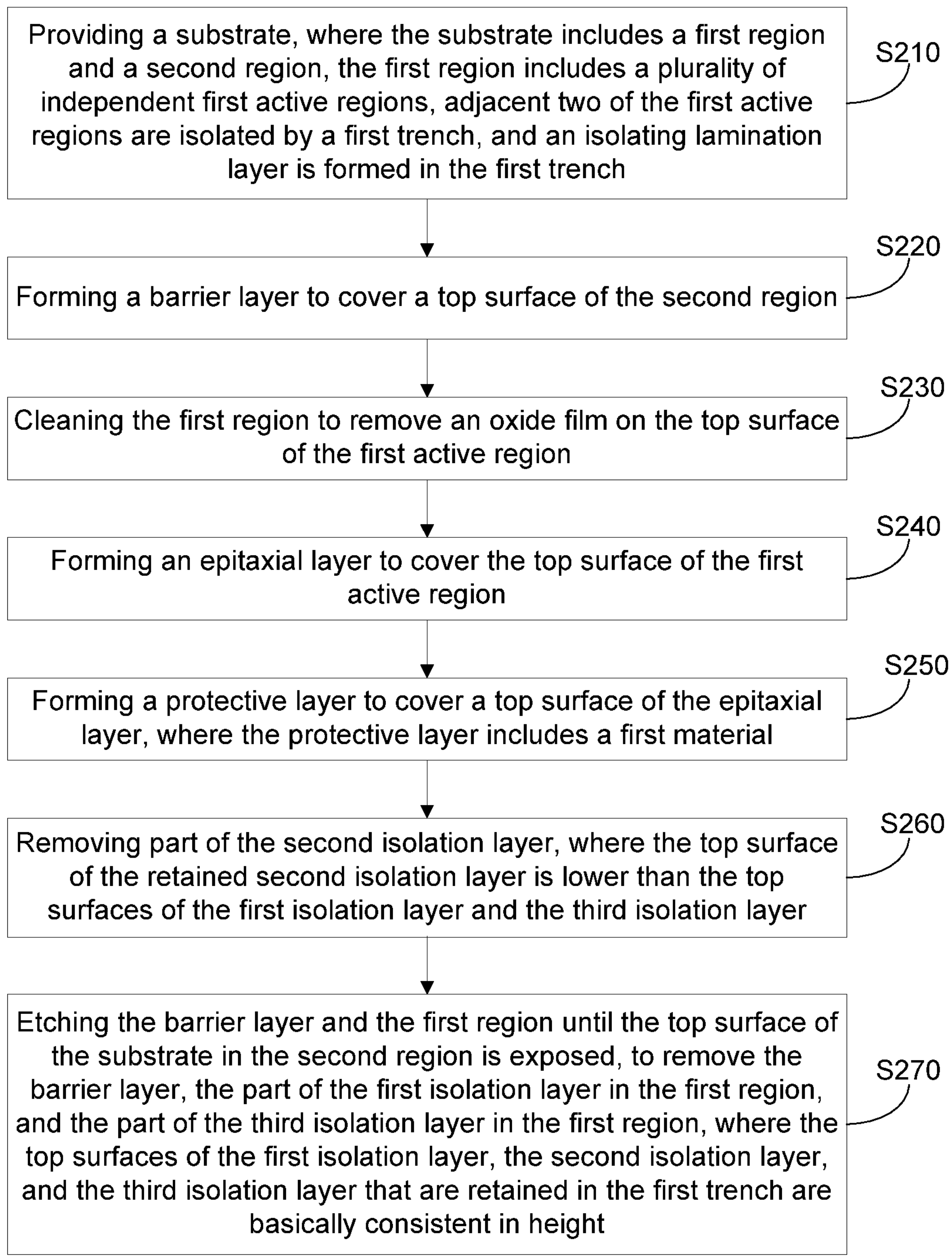
FIG. 2 is a flowchart of a manufacturing method of a semiconductor structure according to an exemplary embodiment.

As shown in FIG. 2, an exemplary embodiment of the present disclosure provides a manufacturing method of a semiconductor structure, including the following steps:

Step S210: Providing a substrate, where the substrate includes a first region and a second region, the first region includes a plurality of independent first active regions, adjacent two of the first active regions are isolated by a first trench, and an isolating lamination layer is formed in the first trench.

As shown in FIG. 4, the substrate 100 is a silicon crystal substrate, the first region 101 includes a PMOSFET region, and the second region 102 includes an NMOSFET region.

The substrate 100 includes one or more first regions 101, where the first region 101 includes a plurality of independent first active regions 110, the adjacent first active regions 110 are separated by a first trench 120. The second region 102 includes a plurality of independent second active regions 130, the adjacent second active regions 130 are isolated by a second trench 140, the first active region 110 and the second active region 130 are of different conductive types.

In this embodiment, the first active region 110 is of a P-type conductive type, and the first active region 110 is configured to form a PMOS device. The second active region 130 is of an N-type conductive type, and the second active region 130 is configured to form an NMOS device.

As shown in FIG. 4, the isolating lamination layer 200 in this embodiment is the same as that in the foregoing embodiment. The isolating lamination layer 200 includes a first isolation layer 210, a second isolation layer 220, and a third isolation layer 230 that are stacked sequentially. The material of the first isolation layer 210 includes silicon oxide, the material of the second isolation layer 220 includes silicon nitride, and the material of the third isolation layer 230 includes silicon oxide. This embodiment and the foregoing embodiment differ in that the isolating lamination layer 200 fills not only the first trench 120, but also the second trench 140, and the isolating lamination layer 200 is also formed in the second trench 140.

Step S220: Forming a barrier layer to cover the top surface of the second region.

In this embodiment, the barrier layer 300 is formed through the following implementations:

As shown in FIG. 5, referring to FIG. 4, first, the initial barrier layer 300*a* is formed to cover the top surface of the substrate 100, and the initial barrier layer 300*a* and the first isolation layer 210 have the same etch selectivity. For example, the initial barrier layer 300*a* may be deposited by atomic layer deposition (ALD). In this embodiment, the material of the initial barrier layer 300*a* can be selected from the same material as the first isolation layer 210. For example, both the materials of the first isolation layer 210 and the initial barrier layer 300*a* include silicon oxide.

Then, the initial barrier layer 300*a* in the first region 101 is removed to expose the top surface of the first active region 110, and the retained initial barrier layer 300*a* forms the barrier layer 300.

Figure 6:
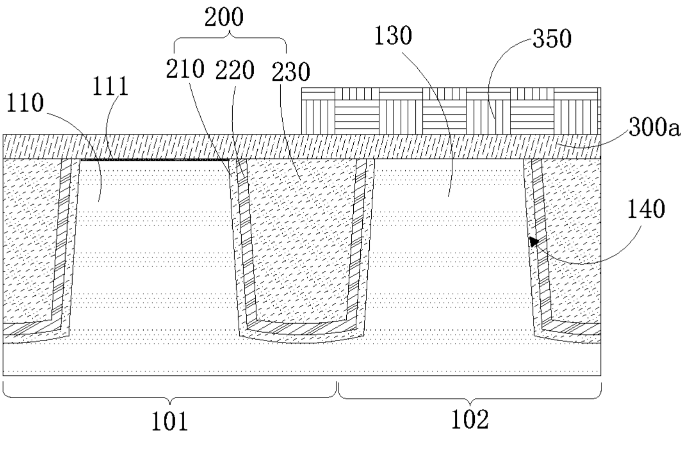
FIG. 6 is a schematic structural diagram of forming a photoresist layer according to an exemplary embodiment.

As shown in FIG. 6, referring to FIG. 5, a photoresist layer 350 is formed to cover the top surface of the initial barrier layer 300*a* in the second region 102. As shown in FIG. 7, referring to FIG. 6, then, the initial barrier layer 300*a* exposed from the photoresist layer 350 is removed through the Certas etching process, to expose the top surface of the first active region 110, and the retained initial barrier layer 300*a* forms the barrier layer 300. Then, the photoresist layer 350 is removed through plasma ashing.

The Certas etching process in this embodiment is a chemical dry etching process. When the initial barrier layer 300*a* is etched through the Certas etching process, the reaction products of the hydrofluoric acid gas and the material of the isolating lamination layer 200 are attached to the top surface of the isolating lamination layer 200, impeding the continuous reaction of the hydrogen fluoride gas with the isolating lamination layer 200. This can mitigate the dishing defect formed in the top surface of the isolating lamination layer 200 during the etching process.

It can be understood that in this embodiment, the coverage of the photoresist layer 350 can be expanded to ensure that the formed barrier layer 300 can expose the top surface of each first active region 110 and part of the isolating lamination layer 200 in each first active region 110.

Step S230: Cleaning the first region to remove an oxide film on the top surface of the first active region.

As shown in FIG. 8, referring to FIG. 7, the first region 101 exposed by the barrier layer 300 is etched. The part of 3 nm to 5 nm at the top of the first active region 110 is removed, to remove the oxide film 111 oxidized naturally on the top surface of the first active region 110, ensuring that the material on the top surface of the first active region 110 is pure and free of impurities, such that the crystallographic orientation of the first material in the epitaxial layer 400 (described in detail in the subsequent steps) subsequently formed on the top surface of the first active region 110 is the same as the crystallographic orientation of the silicon in the first active region 110.

As shown in FIG. 8, in the process of etching off the oxide film 111 on the top surface of the first active region 110, the first isolation layer 210 and the third isolation layer 230 that partially exposed from the first region 101 are removed, top surfaces of the retained first isolation layer 210 and third isolation layer 230 are higher than the top surface of the second isolation layer 220, and thus a groove is formed between the second isolation layer 220 and the first active region 110.

Step S240: Forming an epitaxial layer to cover the top surface of the first active region.

As shown in FIG. 9, referring to FIG. 8, the material of the epitaxial layer 400 is SiGe. The substrate 100 is placed in the reaction chamber, and a silicon source gas and a Ge source gas are both fed into the reaction chamber. For example, dichlorosilane (DCS) or silicon tetrahydroxide ($SiH_4$) can be fed into the reaction chamber as the silicon source gas, and germanane ($GeH_4$) is fed into the reaction chamber as the Ge source gas. The silicon source gas and the Ge source gas react in the reaction chamber to form SiGe, and the SiGe is deposited on the top surface of the first active region 110 to form the epitaxial layer 400.

Step S250: Forming a protective layer to cover the top surface of the epitaxial layer, where the protective layer includes a first material.

As shown in FIG. 9, after the epitaxial layer 400 is formed, feeding the Ge source gas into the reaction chamber is stopped, DCS or $SiH_4$ are continuously fed into the reaction chamber, and hydrogen chloride (HCL) is fed into the reaction chamber. Silicon is deposited on the surface of the epitaxial layer 400 to form the protective layer 410, that is, the first material in this embodiment is silicon.

The thickness of the protective layer 410 formed in this embodiment is 2 nm to 3 nm, for example, it may be 2 nm, 2.2 nm, 2.4 nm, 2.5 nm, 2.7 nm, 2.9 nm, or 3 nm. The thickness of the protective layer 410 is within this range. In the subsequent process, the silicon in the protective layer 410 is sufficient to be completely oxidized by the process environment to form silicon oxide in the subsequent process to etch off the protective layer 410 in the process of etching the first isolation layer 210 and the third isolation layer 230.

In this embodiment, after the formation of the epitaxial layer 400, the protective layer 410 can be formed on the epitaxial layer 400 by adjusting the gas fed into the reaction chamber, without adding equipment to form the protective layer 410, which will reduce production costs and save time costs.

Step S260: Removing part of the second isolation layer, where the top surface of the retained second isolation layer is lower than the top surfaces of the first isolation layer and the third isolation layer.

As shown in FIG. 10, referring to FIG. 9, the second isolation layer 220 exposed from the first region 101 can be etched by wet etching. For example, the second isolation layer 220 can be etched with hot phosphoric acid ($H_3PO_4$) at 150° C. to 200° C. Part of the second isolation layer 220 is dissolved in the hot phosphoric acid, and then the hot phosphoric acid that has dissolved the part of the second isolation layer 220 is removed, the second isolation layer 220 is etched about 15 nm toward the substrate 100, so that the top surface of the second isolation layer 220 retained in the first region 101 is lower than the top surfaces of the first isolation layer 210 and the third isolation layer 230.

Step S270: Etching the barrier layer and the first region until the top surface of the substrate in the second region is exposed, to remove the barrier layer, the part of the first isolation layer in the first region, and the part of the third isolation layer in the first region, where the top surfaces of the first isolation layer, the second isolation layer, and the third isolation layer that are retained in the first trench are basically consistent in height.

Referring to FIG. 10, the barrier layer 300 and the first region 101 are etched by diluted hydrofluoric acid (DHF), to remove the entire barrier layer 300 and part of the first isolation layer 210 and part of the third isolation layer 230 in the first region 101. As shown in FIG. 17, after etching, the first isolation layer 210, second isolation layer 220, and third isolation layer 230 retained in the first trench 120 are basically consistent in height. The top surfaces of the first isolation layer 210, the second isolation layer 220, and the third isolation layer 230 are smoothly connected. The isolating lamination layer 200 retained in the first trench 120 forms a first isolation structure 250, the isolating lamination layer 200 retained in the second trench 140 forms a second isolation structure 260, and the top surface of the first isolation structure 250 is flat without dishing or protrusion defects.

As shown in FIG. 17, referring to FIG. 10, in this embodiment, the protective layer 410 is exposed to the process environment, and silicon in the protective layer 410 is oxidized to form silicon oxide. When the barrier layer 300 and the first region 101 are cleaned by DHF, the oxidized protective layer 410 is removed by the DHF to avoid damage to the epitaxial layer 400 by the etching process, such that the top surface of the epitaxial layer 400 is flat without deflects. This is conducive to improving the performance and yield of PMOS devices formed on epitaxial layer 400.

In the manufacturing method of a semiconductor structure of this embodiment, a material having the same etch selectivity as the first isolation layer and the third isolation layer is used as the barrier layer. When the barrier layer is etched off, the etching speed of the first isolation layer, the third isolation layer, and the barrier layer exposed in the first region is the same. The etching depth of the first isolation layer and the third isolation layer in the first region can be controlled through the process of removing the barrier layer, allowing the top surface of the isolating lamination layer retained in the first region to be flat with no local protrusion or dishing and no turf defect. This provides a good process platform for the PMOS device in the first region, ensuing good performance and higher yield of the formed semiconductor structure, thus preventing charge leakage from occurring to the PMOS device formed on the epitaxial layer.

Figure 3:
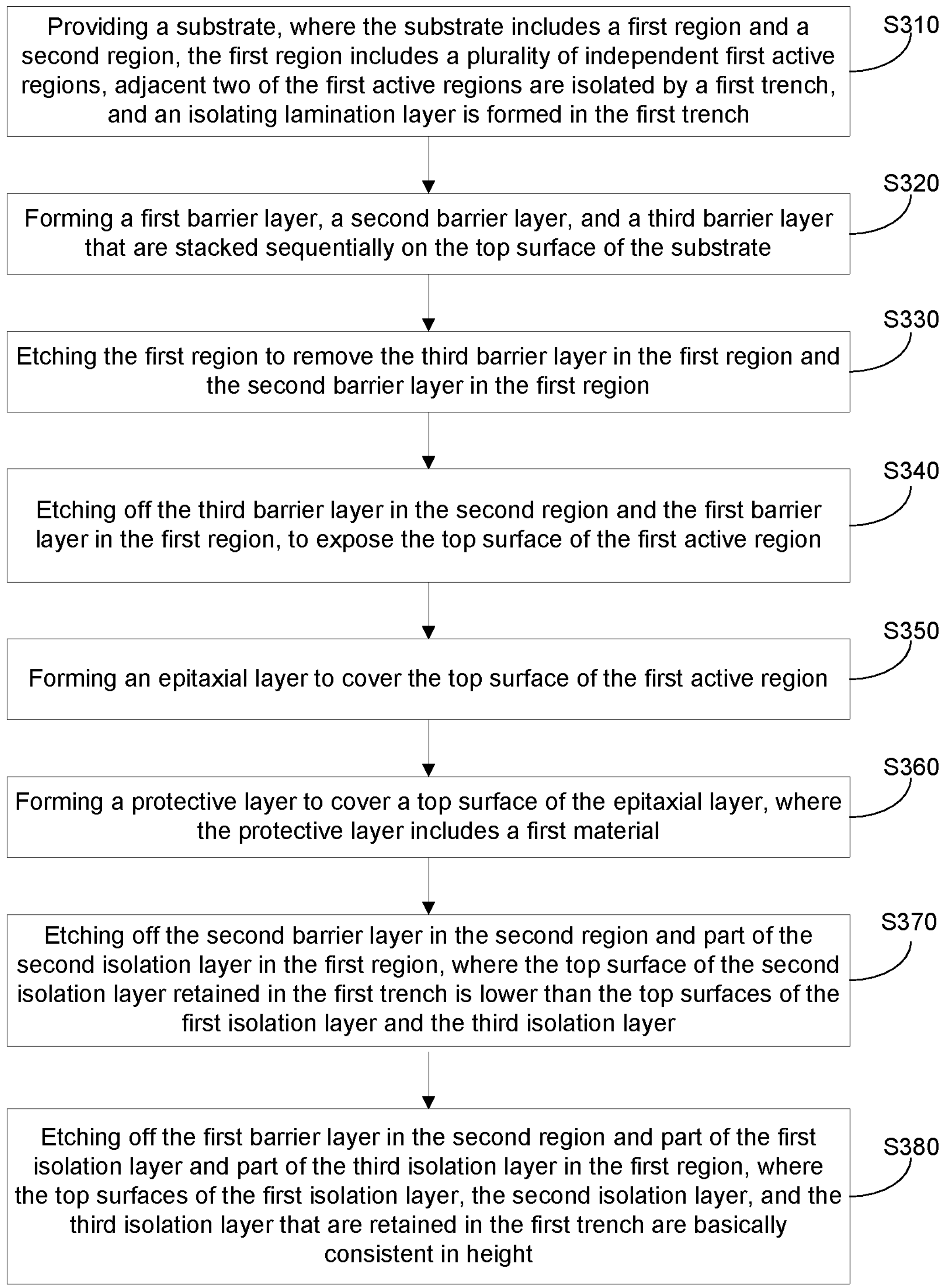
FIG. 3 is a flowchart of a manufacturing method of a semiconductor structure according to an exemplary embodiment.

As shown in FIG. 3, an exemplary embodiment of the present disclosure provides a manufacturing method of a semiconductor structure, including the following steps:

Step S310: Providing a substrate, where the substrate includes a first region and a second region, the first region includes a plurality of independent first active regions, adjacent two of the first active regions are isolated by a first trench, and an isolating lamination layer is formed in the first trench.

As shown in FIG. 4, the substrate 100 provided in this embodiment is the same as the substrate 100 provided in step S210 in the foregoing embodiment, and details are not described herein again. The isolating lamination layer 200 in this embodiment is the same as that in the foregoing embodiment. The isolating lamination layer 200 includes a first isolation layer 210, a second isolation layer 220, and a third isolation layer 230 that are stacked sequentially. The material of the first isolation layer 210 includes silicon oxide, the material of the second isolation layer 220 includes silicon nitride, and the material of the third isolation layer 230 includes silicon oxide.

Step S320: Form a first barrier layer, a second barrier layer, and a third barrier layer that are stacked sequentially on the top surface of the substrate.

As shown in FIG. 11, the barrier layer 300 formed in this embodiment is a stack structure with the same etching characteristics as the isolating lamination layer 200. The barrier layer 300 includes a first barrier layer 310, a second barrier layer 320, and the third barrier layer 330 that are stacked on the substrate 100. The etching depths of layers of the isolating lamination layer 200 are adjusted in the subsequent process through the adjustment on the thicknesses of layers of the barrier layer 300.

As shown in FIG. 11, referring to FIG. 4, the first barrier layer 310, the second barrier layer 320, and the third barrier layer 330 can be formed sequentially on the top surface of the substrate 100 through the ALD process. The first barrier layer 310 and the first isolation layer 210 have the same etch selectivity, the second barrier layer 320 and the second isolation layer 220 have the same etch selectivity, and the first barrier layer 310 and the third barrier layer 330 have the same etch selectivity. In this embodiment, the material of the first barrier layer 310 includes silicon oxide, the material of the second barrier layer 320 includes silicon nitride, and the material of the third barrier layer 330 includes silicon oxide.

In this embodiment, the thickness of the second barrier layer 320 is greater than the total thickness of the first barrier layer 310 and the third barrier layer 330, reserving margin for the depth increase caused by the process impact on the first isolation layer 210 and the third isolation layer 230. For example, the thickness of the first barrier layer 310 is 6 nm, the thickness of the second barrier layer 320 is 12 nm, and the thickness of the third barrier layer 330 is 5.5 nm.

Step S330: Etching the first region to remove the third barrier layer in the first region and the second barrier layer in the first region.

Figure 12:
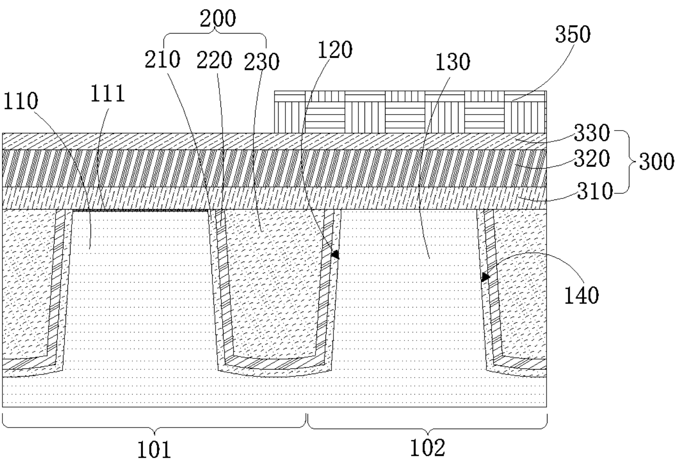
FIG. 12 is a schematic structural diagram of forming a photoresist layer according to an exemplary embodiment.

As shown in FIG. 12, first, forming a photoresist layer 350, which covers the third barrier layer 330 in the second region 102.

Figure 13:
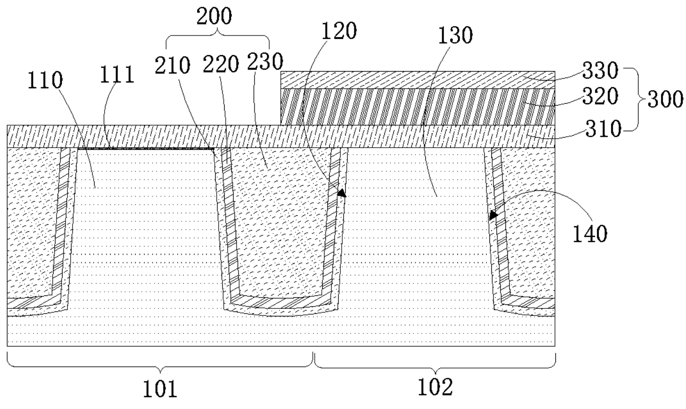
FIG. 13 is a schematic structural diagram of removing a third barrier layer and a second barrier layer in a first region according to an exemplary embodiment.

Referring to FIG. 13, the third barrier layer 330 exposed from the photoresist layer 350 is removed through the Certas etching process, to expose the second barrier layer 320 in the first region 101, and then the photoresist layer 350 is removed through plasma ashing, to expose the third barrier layer 330 in the second region 102.

Referring to FIG. 13, the second barrier layer 320 of the first region 101 is removed by hot phosphoric acid, to expose the first barrier layer 310 of the first region 101.

Step S340: Etching off the third barrier layer in the second region and the first barrier layer in the first region, to expose the top surface of the first active region.

As shown in FIG. 14, referring to FIG. 13, the first barrier layer 310 in the first region 101 and the third barrier layer 330 in the second region 102 are removed through the Certas etching process.

As shown in FIG. 14, in this embodiment, both the first barrier layer 310 and the third barrier layer 330 are made of silicon dioxide. In the process of removing the first barrier layer 310 and the third barrier layer 330 through the Certas etching process, the oxide film 111 formed naturally on the surface of the first active region 110 is also removed, without cleaning off the oxide film 111 on the surface of the first active region 110, which reduces the process steps.

Step S350: Forming an epitaxial layer to cover the top surface of the first active region.

As shown in FIG. 15, the steps of forming the epitaxial layer 400 in this embodiment are the same as those in step S240 of forming the epitaxial layer 400 in the foregoing embodiment, which is not described herein again.

Step S360: Forming a protective layer to cover the top surface of the epitaxial layer, where the protective layer includes a first material.

As shown in FIG. 15, the steps of forming the protective layer 410 in this embodiment are the same as those in step S250 of forming the protective layer 410 in the foregoing embodiment, which is not described herein again.

Step S370: Etching off the second barrier layer in the second region and part of the second isolation layer in the first region, where the top surface of the second isolation layer retained in the first trench is lower than the top surfaces of the first isolation layer and the third isolation layer.

As shown in FIG. 16, referring to FIG. 15, the second barrier layer 320 in the second region 102 and the second isolation layer 220 in the first region 101 are wet etched by hot phosphoric acid, to remove the entire second barrier layer 320 in the second region 102. The etching is stopped when the top surface of the first barrier layer 310 in the second region 102 is exposed. The second isolation layer 220 in the first region 101 is etched towards the substrate 100 by approximately 12 nm to 15 nm, such that the top surface of the second isolation layer 220 retained in the first region 101 is lower than the top surfaces of the first isolation layer 210 and the third isolation layer 230.

Step S380: Etching off the first barrier layer in the second region and part of the first isolation layer and part of the third isolation layer in the first region, where the top surfaces of the first isolation layer, the second isolation layer, and the third isolation layer that retained in the first trench are basically consistent in height.

As shown in FIG. 17, referring to FIG. 16, the first barrier layer 310 in the second region 102 and part of the first isolation layer 210 and part of the third isolation layer 230 in the first region 101 are etched off by DHF. Such etching is stopped when the top surface of the substrate 100 in the second region 102 is exposed. After etching, the first isolation layer 210, the second isolation layer 220, and the third isolation layer 230 that are retained in the first trench 120 are basically consistent in top surface height. In addition, the etching process with DHF also removes the protective layer 410, exposing the top surface of the epitaxial layer 400.

In the manufacturing method of a semiconductor structure of this embodiment, a lamination structure having the same etching characteristics as the layers of the isolating lamination layer is used as a barrier layer. The etching depth of each layer of the isolating lamination layer can be adjusted subsequently through the adjustment on the thickness of each layer of the barrier layer, such that the top surface of the isolating lamination layer retained in the first region has no turf defects, thus improving a good process platform for forming the PMOS device in the first region and preventing charge leakage from subsequently occurring to the PMOS device formed on the epitaxial layer.

An exemplary embodiment of this present disclosure provides a semiconductor structure, as shown in FIG. 17, the semiconductor structure includes a substrate 100, a first isolation structure 250, and an epitaxial layer 400. The substrate 100 includes a first region 101 and a second region 102. The first region 101 includes a plurality of independent first active regions 110, and adjacent first active regions 110 are isolated by a first trench 120. The first isolation structure 250 is disposed in the first trench 120, where in a direction from the wall of the first trench 120 to its center, the first isolation structure 250 includes a structure of multiple layers sequentially covering the first trench 120, and joints of top surfaces of the layers of the first isolation structure 250 are basically consistent in height.

In some embodiments, as shown in FIG. 17, the first isolation structure 250 includes a first isolation layer 210, a second isolation layer 220, and a third isolation layer 230 that sequentially cover the first trench 120. The first isolation layer 210 covers a bottom wall and part of a side wall of the first trench 120. The second isolation layer 220 covers the first isolation layer 210, the third isolation layer 230 covers the second isolation layer 220, and the top surfaces of the first isolation layer 210, the second isolation layer 220, and the third isolation layer 230 are basically consistent in height.

In some embodiments, as shown in FIG. 17, the epitaxial layer 400 includes a first material, and in a cross-section perpendicular to the top surface of the substrate 100, the concentration of silicon at the top and bottom of the epitaxial layer 400 is greater than that in the middle of the epitaxial layer 400.

In some embodiments, as shown in FIG. 17, the second region 102 includes a plurality of independent second active regions 130, adjacent second active regions 130 are isolated by a second trench 140. A second isolation structure 260 is disposed in the second trench 140, the first active region 110 and the second active region 130 have different conductive types.

In this embodiment, as shown in FIG. 17, the first region 101 includes a PMOSFET region, and the second region 102 includes an NMOSFET region. The first active region 110 is of a P-type conductive type, and the first active region 110 is configured to form a PMOS device. The second active region 130 is of an N-type conductive type, and the second active region 130 is configured to form an NMOS device.

In the semiconductor structure of this embodiment, the top surface of first isolation structure 250 has no dishing or protrusion defects, which can avoid charge leakage of the device on the epitaxial layer 400 to the first isolation structure 250 caused by the formation of electron traps due to the defects at the top of the first isolation structure 250, thus ensuring good electrical performance of the semiconductor structure.

The embodiments or implementations of this specification are described in a progressive manner, and each embodiment focuses on differences from other embodiments. The same or similar parts between the embodiments may refer to each other.

In the description of this specification, reference terms "an embodiment", "an illustrative embodiment", "some implementations", "an illustrative implementation", "an example", etc., mean that a particular feature, structure, material, or characteristic described in conjunction with the embodiment or example is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

In the description of the present disclosure, it is to be noted that the terms "central", "upper", "lower", "left", "right", "vertical", "horizontal", "inner", "outer", etc. indicate azimuthal or positional relations based on those shown in the drawings only for ease of description of the present disclosure and for simplicity of description, and are not intended to indicate or imply that the referenced device or element must have a particular orientation and be constructed and operative in a particular orientation, and thus may not be construed as a limitation on the present disclosure.

It may be understood that the terms "first", "second", etc. as used in the present disclosure may be used to describe various structures in the present disclosure, but these structures are not limited by these terms. These terms are only used to distinguish a first structure from another structure. In one or more accompanying drawings, the identical elements are denoted by the identical or similar reference numerals. For clarity, many parts in the accompanying drawings are not drawn to scale. In addition, certain well-known parts may not be shown. For brevity, a structure obtained after several steps may be described in one figure. Numerous specific details of the present disclosure are described below, for example, structures, materials, dimensions, processes, and techniques of devices in order to provide a clearer understanding of the present disclosure. However, as will be understood by those skilled in the art, the present disclosure may be practiced without these specific details.

Finally, it should be noted that the above embodiments are merely intended to illustrate the technical solution of the present disclosure and not to limit the same; although the present disclosure has been described in detail with reference to the foregoing embodiments, it should be understood by those skill in the art that the technical solutions described in the foregoing embodiments may be modified or equivalents may be substituted for some or all of the technical features thereof; and the modification or substitution does not make the essence of the corresponding technical solution deviate from the scope of the technical solution of each embodiment of the present disclosure.

INDUSTRIAL APPLICABILITY

In the manufacturing method of a semiconductor structure and the semiconductor structure provided by the present disclosure, after the epitaxial layer is formed on the top surface of the first active region, part of the isolating lamination layer in the first region is etched off, such that the top surface of the isolating lamination layer retained in the first region has no turf defects, which can avoid charge leakage of the device formed on the epitaxial layer, and ensure that the formed semiconductor structure has excellent performance and higher yield.

The invention claimed is:

1. A manufacturing method of a semiconductor structure, comprising:

providing a substrate, wherein the substrate comprises a first region and a second region, the first region comprises a plurality of independent first active regions, wherein each pair of adjacent first active regions is isolated by a first trench, and an isolating lamination layer is formed in the first trench, wherein the isolating lamination layer comprises a first isolation layer, a second isolation layer, and a third isolation layer that sequentially cover the first trench, the first isolation layer and the third isolation layer have a same etch selectivity, the first isolation layer and the second isolation layer have different etch selectivity;

forming a barrier layer covering a top surface of the second region;

forming an epitaxial layer covering a top surface of each of the first active regions; and etching off the barrier layer and part of the isolating lamination layer in the first region, wherein joints of top surfaces of layers in the isolating lamination layer retained in the first region are basically consistent in height, and wherein the etching off part of the isolating lamination layer in the first region comprises:

removing part of the second isolation layer, such that a top surface of the remaining second isolation layer is lower than respective top surfaces of the first isolation layer and the third isolation layer; and removing part of the first isolation layer and part of the third isolation layer, such that a top surface of the remaining first isolation layer, a top surface of the third isolation layer, and a top surface of the remaining second isolation layer are basically consistent in height.

2. The manufacturing method of a semiconductor structure according to claim 1, wherein the forming a barrier layer comprises:

forming an initial barrier layer covering a top surface of the substrate, wherein the initial barrier layer and the first isolation layer have a same etch selectivity; and removing the initial barrier layer in the first region to expose the top surface of each of the first active regions, wherein the remaining initial barrier layer forms the barrier layer.

3. The manufacturing method of a semiconductor structure according to claim 2, further comprising:

cleaning the first region to remove an oxide film on the top surface of the first active region.

4. The manufacturing method of a semiconductor structure according to claim 2, wherein the removing part of the first isolation layer and part of the third isolation layer comprises:

etching the barrier layer and the first region until the top surface of the substrate in the second region is exposed, to remove the barrier layer, the part of the first isolation layer in the first region, and the part of the third isolation layer in the first region, wherein the top surfaces of the first isolation layer, the second isolation layer, and the third isolation layer that are retained in the first trench are basically consistent in height.

5. The manufacturing method of a semiconductor structure according to claim 1, wherein the forming a barrier layer comprises:

forming a first barrier layer, a second barrier layer, and a third barrier layer that are stacked sequentially on a top surface of the substrate, wherein the first barrier layer and the first isolation layer have a same etch selectivity, the second barrier layer and the second isolation layer have a same etch selectivity, and the first barrier layer and the third barrier layer have a same etch selectivity; and a thickness of the second barrier layer is greater than a total thickness of the first barrier layer and the third barrier layer.

6. The manufacturing method of a semiconductor structure according to claim 5, further comprising:

etching the first region to remove the third barrier layer in the first region and the second barrier layer in the first region; and etching off the third barrier layer in the second region and the first barrier layer in the first region, to expose the top surface of the first active region.

7. The manufacturing method of a semiconductor structure according to claim 6, wherein the etching off the barrier layer and part of the isolating lamination layer in the first region comprises:

etching off the second barrier layer in the second region and part of the second isolation layer in the first region, wherein the top surface of the second isolation layer retained in the first trench is lower than the top surfaces of the first isolation layer and the third isolation layer; and etching off the first barrier layer in the second region and part of the first isolation layer and part of the third isolation layer in the first region, wherein top surfaces of the first isolation layer, the second isolation layer, and the third isolation layer that are retained in the first trench are basically consistent in height.

8. The manufacturing method of a semiconductor structure according to claim 1, further comprising:

forming a protective layer covering a top surface of the epitaxial layer, wherein the protective layer comprises a first material.

9. The manufacturing method of a semiconductor structure according to claim 1, wherein the second region comprises a plurality of independent second active regions, each pair of adjacent second active regions is isolated by a second trench, the isolating lamination layer is formed in the second trench, and each of the first active regions and each of the second active regions are of different conductive types.

10. The manufacturing method of a semiconductor structure according to claim 9, wherein the first region comprises a P-channel metal-oxide semiconductor field-effect transistor (PMOSFET) region, and the second region comprises an N-channel metal-oxide-semiconductor field-effect transistor (NMOSFET) region.

* * * * *